United States Patent [19]

Mita et al.

[11] Patent Number: 5,196,725
[45] Date of Patent: Mar. 23, 1993

[54] HIGH PIN COUNT AND MULTI-LAYER WIRING LEAD FRAME

[75] Inventors: Mamoru Mita; Shoji Takagi, both of Hitachi; Seigi Aoyama, Kitaibaraki, all of Japan

[73] Assignee: Hitachi Cable Limited, Tokyo, Japan

[21] Appl. No.: 711,214

[22] Filed: Jun. 6, 1991

[30] Foreign Application Priority Data

Jun. 11, 1990 [JP] Japan ............................. 2-152156
Mar. 14, 1991 [JP] Japan ............................. 3-049675

[51] Int. Cl.⁵ ..................... H01L 23/48; H01L 23/12
[52] U.S. Cl. .................................. 257/672; 257/666; 257/691
[58] Field of Search ................... 357/70, 81, 80, 71

[56] References Cited

U.S. PATENT DOCUMENTS

| | | | |
|---|---|---|---|
| 4,891,687 | 1/1990 | Mallik et al. | 357/70 |
| 4,933,741 | 6/1990 | Schroeder | 357/70 |
| 4,975,761 | 12/1990 | Chu | 357/81 |
| 5,012,386 | 4/1991 | McShane et al. | 357/81 |
| 5,049,974 | 9/1991 | Nelson et al. | 357/80 |
| 5,067,005 | 11/1991 | Michii et al. | 357/81 |

FOREIGN PATENT DOCUMENTS

WO88/05962 8/1988 World Int. Prop. O. .

Primary Examiner—Rolf Hille
Assistant Examiner—S. V. Clark
Attorney, Agent, or Firm—Frishauf, Holtz, Goodman & Woodward

[57] ABSTRACT

A high pin count and multi-layer lead frame according to the present invention which has a short pitch, high density lead pattern and at the same time, enhanced transmission characteristics for high-frequency signals includes at least one pair of conductive layers for grounding, power supply or both of them and one pair of insulating layers formed on these conductive layers, inner leads formed on the insulating layer on the top conductive layer by etching or vapor deposition in a short pitch, high density pattern, and outer leads made of metal frame. The inner leads are electrically connected to the leads for signals of the outer leads, the leads for grounding and power supply of the outer leads are connected to each of the conductive layers separately, and a plurality of holes for wire bonding the electrodes of a semiconductor element to each of the conductive layers are formed on each of the insulating layers.

13 Claims, 4 Drawing Sheets

HIGH PIN COUNT AND MULTI-LAYER WIRING LEAD FRAME

BACKGROUND OF THE INVENTION

The present invention relates to a high pin count and multi-layer wiring lead frame for resin sealed semiconductor devices, and particularly to a high pin count and multi-layer wiring lead frame which achieves high density of the conductive bond locations of an IC device, and has excellent transmission characteristics and outer leads with predetermined rigidity.

In the prior art, a lead frame for semiconductor devices consists of a single-layer lead frame made of metal formed on a flat plate to reduce the size of semiconductor packages. This single-layer lead frame has a simple shape. However, since terminals for power supply to lead frames and semiconductor elements and terminals for signals are placed close to each other on the same plane, electromagnetic interferences between the terminals occur. That is, a crosstalk occurs when high frequency signals are transmitted, thus making it impossible to achieve good transmission characteristics. In addition, as the lead frame is not provided with a grounding layer which can remove an induction current properly, capacitance becomes large with the result of deteriorated transmission characteristics.

A multi-layer lead frame wherein an insulating layer is sandwiched between a grounding layer and a power supply layer, and the grounding terminal and power supply terminal of a semiconductor element are bonded to the grounding layer and power supply layer, respectively, to overcome this problem, has recently been reported.

However, this multi-layer lead frame is also a metal frame having inner leads integrated with outer leads. Therefore, the thickness of this type of lead frame should not fall below a certain level in order to achieve strength, with the result that the whole lead frame becomes bulky.

In addition, as the high-density arrangement of inner leads at the tip thereof is difficult for punching, the pitch of the inner leads of the lead frame should be beyond a certain level. For instance, a lead frame with a thickness of 0.10 mm has a limit pitch of 0.18 mm. That is, it has been impossible to further increase the inner lead counts.

Tape Pac QFP (Quad Flat Package) manufactured by NSC of the US is an example of a lead frame which has a greater number of leads due to shortened wire lengths. This package has a TAB tape carrier structure wherein LSI elements and leads are connected by the gang bonding method. However, since the package has only a single wiring layer, transmission speed cannot be increased.

When a lead frame has a large number of lead terminals, the transmission characteristics of the lead frame becomes more important.

In such a lead frame, various devices are provided to improve transmission characteristics in the case that high frequency signals are applied, in addition to the fine line definition of high density lead fingers.

Generally, the delay time ($T_0$) of the high frequency signal is represented by the following equation:

$$T_0 = \iota \cdot C_0 \cdot Z_0 = \iota \cdot L_0 \cdot C_0$$

where $\iota$ represents wire length, $C_0$ capacitance, $Z_0$ impedance and $L_0$ inductance.

$$Z_0 = L_0/C_0 = (K/\sqrt{\epsilon_r}) \, d/w$$

where $\epsilon_r$ is permittivity, w wire distance and d the thickness of an insulating layer.

As understood from the above equations, when the high-frequency signal is applied, the delay time is mainly relative to capacitance and impedance.

However, the capacitance and inductance of the single-layer metal lead frame of the prior art relative to the delay time cannot be reduced sufficiently.

BRIEF SUMMARY OF THE INVENTION

It is an object of the present invention to eliminate the problems of the prior art described in the foregoing and to provide a high pin count and multi-layer wiring lead frame which enables the fine line definition of high-density leads while maintaining the rigidity of the leads, particularly outer leads, and which can improve transmission characteristics, particularly high-frequency signal transmission characteristics.

To achieve the above object, the first aspect of the present invention is to provide a high pin count and multi-layer wiring lead frame comprising a conductive layer for grounding, power supply, or both of them, an insulating layer formed on said conductive layer, inner leads formed on said insulating layer in a short pitch, high density pattern by etching or vapor deposition, outer leads made of metal frame having leads for signals and leads for grounding, power supply, or both of them, wherein said inner leads are electrically, connected to the leads for signals of said outer leads, the leads for grounding, power supply, or both of them of said outer leads are jointed to said conductive layer, and a plurality of holes for wire bonding the electrode of a semiconductor element to said conductive layer are formed on said insulating layer.

Preferably, said insulating layer has cut-out portions for exposing said conductive layer.

Preferably, the conductive layer exposed from said cutout portions is provided with bumps for connecting said outer leads.

Then, the second aspect of the present invention is to provide a high pin count and multi-layer wiring lead frame comprising at least one pair of conductive layers for grounding and power supply to be laminated, insulating layers separately formed on each of said conductive layers, inner leads formed on the insulating layer on top of the upper conductive layer by etching or vapor deposition in a short pitch, high density pattern, outer leads formed on the metal frame including leads for signals, leads for grounding and leads for power supply, wherein said inner leads are electrically connected to the leads for signals of said outer leads, the leads for grounding and the leads for power supply of said outer leads are connected to said conductive layer for grounding and the conductive layer for power supply, respectively, and a plurality of holes for wire bonding the electrode of an semiconductor element to each of said conductive layers are formed on each of said insulating layers.

Preferably, said lead frame is a three-layer wiring structure which includes five layers: said inner leads, said insulating layer, said conductive layer for grounding, said insulating layer and said conductive layer for power supply, in this order.

Preferably, cut-out portions for exposing each of said conductive layers are provided in the corners of a flexible multi-layer wiring board including said inner leads and a plurality of insulating layers and conductive layers.

Preferably, in above both aspects, the tips of said inner leads and said conductive layer or both of said conductive layers, exposed from said holes formed on said conductive layer are plated with gold or silver.

Preferably, said inner leads formed on said insulating layer are formed by etching a copper foil layer on a polyimide film having a copper foil on one side thereof.

Preferably, said inner leads are properly aligned with and connected to the leads for signals of said outer leads simultaneously.

DETAILED DESCRIPTION OF THE INVENTION

Figure 1:
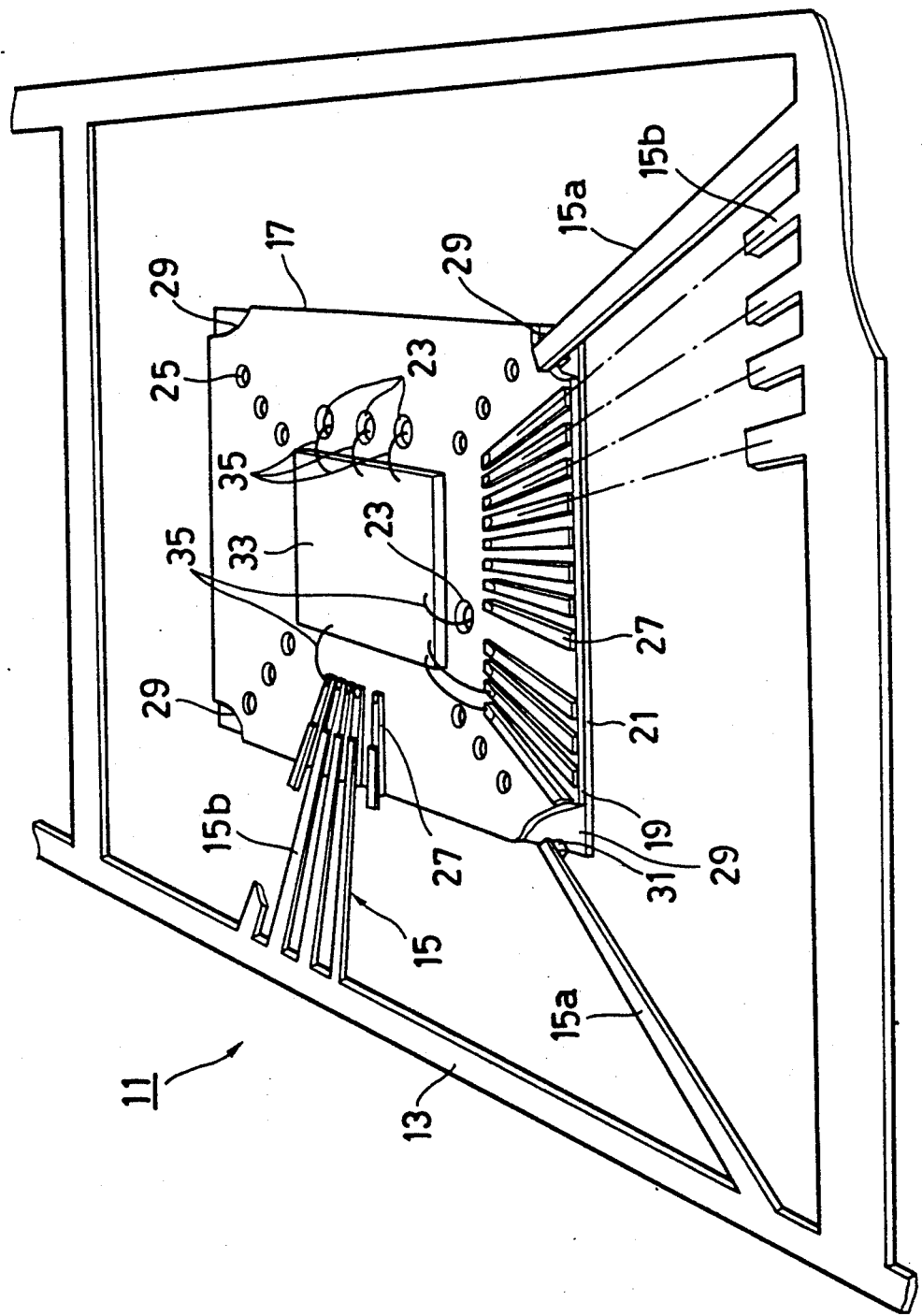
FIG. 1 is a partially cutway perspective view of an embodiment of the high pin count and multi-layer wiring lead frame according to the first aspect of the present invention.

The present invention is based on the development of the following technologies.

(1) the development of micro-soldering technology for interconnecting inner and outer leads at a pitch of 0.37 mm which makes possible the multi-layer structure of lead frames (2) the formation of a conductive layer for grounding and/or power supply on the reverse of a flexible printed circuit board to discharge an induction current (3) the use of polyimide in the insulating layer, whereby permittivity is reduced from 3.9 to 2.0, compared with the prior art package sealing resin, thus lowering capacitance (4) the establishment of technology for wire bonding from a bottom land of a hole for grounding and/or power supply In a multi-layer lead frame according to the present invention, inner leads are disposed in a high density pattern by etching or vapor deposition. Therefore, it is possible to significantly reduce a lead pitch. Furthermore, after the inner leads are aligned properly with the signal leads of tape-like outer leads, they are joined together by microbonding technology, for instance, so that the outer leads on the frame are precisely interconnected electrically to the inner leads on the insulating layer.

In addition, the leads for grounding and/or power supply of outer leads are connected to a conductive layer for grounding and/or power supply so that power supplied from the leads for both grounding and power supply is made uniform by the conductive layer for both grounding and power supply. As a result, voltage can be supplied stably. At the same time, even if a current is concentrated on a specific location of an IC chip at the time of power supply after a semiconductor element is mounted on the chip, the current is short-circuited swiftly to the conductive layer described above, thus eliminating the concentration of the current on a specific lead.

Furthermore, since a plurality of holes (usually called "wire bonding holes") are formed on the insulating layer and the conductive layer described above is exposed from these holes, the conductive layer can be directly wire bonded to the power terminals of the semiconductor element through the holes and at the same time, insulation from other leads is ensured. Grounding the conductive layer can discharge an induction current and can lower inductance. Moreover, when the bonding connection between the conductive layer and the power terminals of the semiconductor element is located at the periphery of the semiconductor element where connection is easy, the length of the bond wire becomes much smaller than that of the lead frame, which contributes to a reduction in delay time. A reduction in the wire length also leads to a reduction in the self inductance of the wires, whereby potential variations caused by switching are minimized.

It is preferred that the conductive layer exposed from the holes of the insulating layer and the tips of the inner leads are plated with gold or silver. The reason for this is to facilitate the bonding of wires, and to eliminate floating capacitance caused by improper bonding.

A high pin count and multi-layer wiring lead frame according to a preferred embodiment of the present invention will be described in more detail, with reference to the accompanying drawings.

FIG. 1 is a partially cutway perspective view of an embodiment of a high pin count and multi-layer wiring lead frame according to the first aspect of the present invention. Note that a part of the lead frame is omitted or simplified in the figure for explanation and accordingly, the lead frame shown in the figure is different from a real lead frame.

The high pin count and multi-layer wiring lead frame 11 (hereinafter referred to as "lead frame") according to the present invention is a composite structure comprising an outer metal frame and an inner flexible printed circuit, that is flexible multi-layer printed circuit board 17 (hereinafter referred to as "multi-layer printed circuit board").

The metal frame is provided with a rectangular outer frame 13, and a plurality of outer leads 15 (15a and 15b) extend toward the center of the outer frame 13 from each side of the outer frame 13. The outer leads 15a extending from the vicinity of the four corners of the outer frame 13 are used as leads for grounding or power supply, or leads for both grounding and power supply. The outer leads 15b extending from each side of the frame are used as leads for both power supply and signals, leads for both grounding and signals, or leads for signals. The metal frame having the outer frame 13 and the outer leads 15 is made of known conductive material such as copper, copper alloy, silver, 42 alloy (Fe-42% Ni alloy), ferrous alloy such as Kovar (copper alloy containing 29% of iron and 17% of nickel), and non-ferrous alloy. The frame is produced from one of these conductive materials through punching, pressing and etching.

The thickness of the outer leads 15 is not limited if the leads have a needed rigidity (strength). The thickness differs by kind of material in use, but for instance, the thickness of the outer leads made of 42 alloy is preferably not less than 0.10 mm (100 μm). The pitch of the tips of the outer leads 15 is preferably made as small as possible and not limited if the leads have a required rigidity. For instance, the pitch for the outer leads 15 made of 42 alloy is preferably 0.15 mm (150 μm).

At the center of the outer frame 13 of the lead frame 11, there is provided a multi-layer wiring board 17. The multi-layered wiring board 17 includes three layers: (1) a signal layer on which a large number of inner leads 27 are formed in a short pitch, high density pattern, (2) an insulating film layer 19 which is made of polyimide film supporting the inner leads 27, and (3) a conductive layer 21 for grounding or power supply or both of them. It has a double-layer wiring structure comprising the signal layer and the conductive layer 21 described in the foregoing.

An unshown protective layer made of polyimide or the like may be provided on the rear of the conductive layer 21 to make the whole lead frame 11 comprising five layers including the outer leads 15.

The inner leads 27 may be formed by vapor depositing a conductive material such as copper, silver or gold on the insulating film layer 19, or by etching the conductive layer made of conductive metal foil such as copper coil formed on the insulating film layer 19. As a result, the inner leads 27 can be disposed in a short pitch, high density pattern.

In the present invention, a double-layer CCL (copper clad laminate) made of copper foil signal layer and polyimide film (insulating layer 19), that is a polyimide film with a copper foil formed on one side, is preferably used to form the inner leads 27. In this case, the copper foil is etched by a known method later to become the inner leads 27.

The thickness of the inner leads 27 and the pitch of the tips thereof are not limited as far as the fine line definition of high density inner leads, connection with the outer leads 15b and wire bonding with the semiconductor element 33 are possible. Therefore, a smaller thickness and a finer pitch are preferred. For instance, when a copper foil is used, the preferable thickness ranges from 15 to 40 μm and the preferable pitch from 90 to 180 μm. A known conductive material having high conductivity can be used in the inner leads 27.

The insulating film layer 19 can be made of any resin film having high thermal resistance and insulating properties such as a polyimide film, bismaleimide triazine (BT) resin film or the like. Known resin films for use in printed wiring boards or flexible wiring boards can be used. The insulating film layer 19 is not limited in thickness as far as it can support the inner leads 27 and mount the semiconductor element 33 at the center. For instance, the preferred thickness ranges from 20 to 100 μm.

The conductive layer 21 is joined to the rear side (opposite to the inner leads 27) of the insulating film layer 19 with an adhesive or the like as a conductor for power supply or grounding, or for both of them, and functions to reduce the resistance and inductance, and increase the capacitance of the leads for power supply or grounding, or for both of them, thus lowering the capacitance and impedance of leads for signals. The conductive layer can be made of any material having sufficient conductivity. Therefore, existing known conductive materials such as copper, copper alloy, silver, silver alloy, 42 alloy, ferrous alloy including Kovar and non-ferrous alloy can be used.

A high pin count and multi-layer wiring lead frame according to the first aspect of the present invention wherein the conductive layer 21 functions as a typical conductive layer for both power supply and grounding will be described below.

In the lead frame 11 as shown in FIG. 1, wire bonding holes 23 for both power supply and grounding, and lock holes 25 for alleviating stress caused by resin molding are formed on the insulating film layer 19 of the multi-layer wiring board 17 at desired locations by press punching or the like. Cut-out portions 29 are provided at the four corners of the film layer to expose the conductive layer 21 from the insulating film layer 19.

The inside tips of the inner leads 27 of the multi-layer wiring board 17 are coated with base plating such as Sn—Ni and good conductor such as gold formed on the base to achieve proper wire bonding. The conductive layer 21 of the multi-layer wiring board 17 exposed from the wire bonding hole 23 is also coated with base plating such as Sn—Ni and good conductor such as gold formed on the base. These good conductors can be plated simultaneously.

Figure 2:
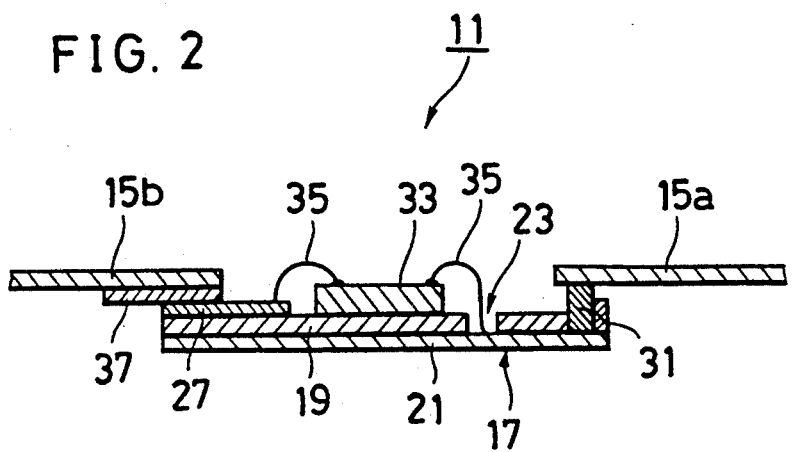
FIG. 2 is a sectional view of other embodiment of the high pin count and multi-layer wiring lead frame according to the first aspect of the present invention.

The outer leads 15 of the lead frame 11 described in the foregoing are electrically connected to the inner leads 27 of the multi-layer wiring board 17 by overlapping properly the outer leads 15 with the inner leads 27 via the solder plated layer 37 and by joining them together using the infrared beam heating method after the tips of the outer leads 15 are solder plated (refer to FIG. 2).

In FIG. 1, out of the outer leads 15 of the lead frame 11, leads extending from the vicinity of the four corners of the outer frame 13 are used as leads 15a for both grounding and power supply and the other leads used as leads 15b for signals. The leads 15b for signals are connected to the inner leads 27 as described above, while the leads 15a for both grounding and power supply are connected directly to the conductive layer 21. The bumps 31 are formed for these connections by solder plating at the corners of the conductive layer 21 exposed from the cut-out portions 29 of the insulating film layer 19 described in the foregoing. The tips of the leads 15a for both grounding and power supply are contacted to the bumps 31 and thermally joined to it to provide a continuous conductive path between the conductive layer 21 and the leads 15a for both grounding and power supply. The bumps 31 may be formed on the outer leads 15a in advance (refer to FIG. 2).

A semiconductor element 33 is mounted on the high pin count and multi-layer wiring lead frame 11. The signal terminal of the semiconductor element 33 are connected to the plated terminal of the inner leads 27 by bonding wires 35, and at the same time, the grounding terminals of the semiconductor element 33 are further bonded to the portions of the conductive layer 21 exposed from the hole 23 for both grounding and power supply of the insulating film layer 19 by the bonding wires 35 (refer to FIGS. 2 and 3). Finally, the inner leads 27 are resin sealed to produce a semiconductor device.

When a double-layer CCL (copper clad laminate) consisting of a copper foil signal layer and a polyimide resin layer is used to form the inner leads 27 on the insulating film layer 19 in the production of the multi-layer wiring board 17 of the lead frame 11 according to the present invention, the wire bonding holes 23, the lock holes 25 and the cut-out portions 29 for the four corners of the frame are first formed on the double-layer CCL at predetermined locations by press punching or the like. Then, the conductive layer 21 is attached to the polyimide resin layer (insulating film layer 19) of the double-layer CCL using an adhesive or the like. Afterwards, the copper foil layer of the double-layer CCL is etched to form the inner leads 27, thus producing the multi-layer wiring board 17.

In the production of the multi-layer wiring board 17, it is not necessary to use the double-layer CCL, and a metal foil layer for the formation of the inner leads 27 and the conductive layer 21 may be adhered to the polyimide insulating film layer 19 using an adhesive or the like. The procedure for attaching the metal foil layer and the conductive layer 21 to the insulating film layer 19 is not limited, but it is recommended that the holes 23 and the cutout portions 29 should be formed at least before the conductive layer 21 is adhered. The formation of the inner leads 27 is not limited, and may be performed before or after the bonding of the conductive layer 21 to the insulating film layer 19 by etching the metal foil or vapor deposition as described in the foregoing.

After this, the multi-layer wiring board 17 is coated with various platings to connect the various terminals of the semiconductor element 33 and the outer leads 15 (15a and 15b), leads 27 and the cut-out portions 29 are thermally joined to the outer leads 15b and the outer leads 15a, respectively to produce the high pin count and multi-layer wiring lead frame 11 of the present invention.

Finally, the semiconductor element 33 is mounted at the center of the lead frame 11, and the terminals thereof are wire bonded to the inner leads 27 and the conductive layer within the holes 23. Then, the whole composite assembly is resin molded to produce a semiconductor device.

The high pin count and multi-layer wiring lead frame according to the first aspect of the present invention is basically configured as described above.

A high pin count and multi-layer wiring lead frame according to the second aspect of the present invention will be described in detail, with reference to FIGS. 4 to 6.

The high pin count and multi-layer wiring lead frame according to the second aspect has the same multi-layer wiring structure as the high pin count and multi-layer wiring lead frame according to the first aspect, but it has three or more layers, compared with two layers for the latter. They are different from each other at least in that the conductive layer for power supply and the conductive layer for grounding are separated from each other.

Figure 3:
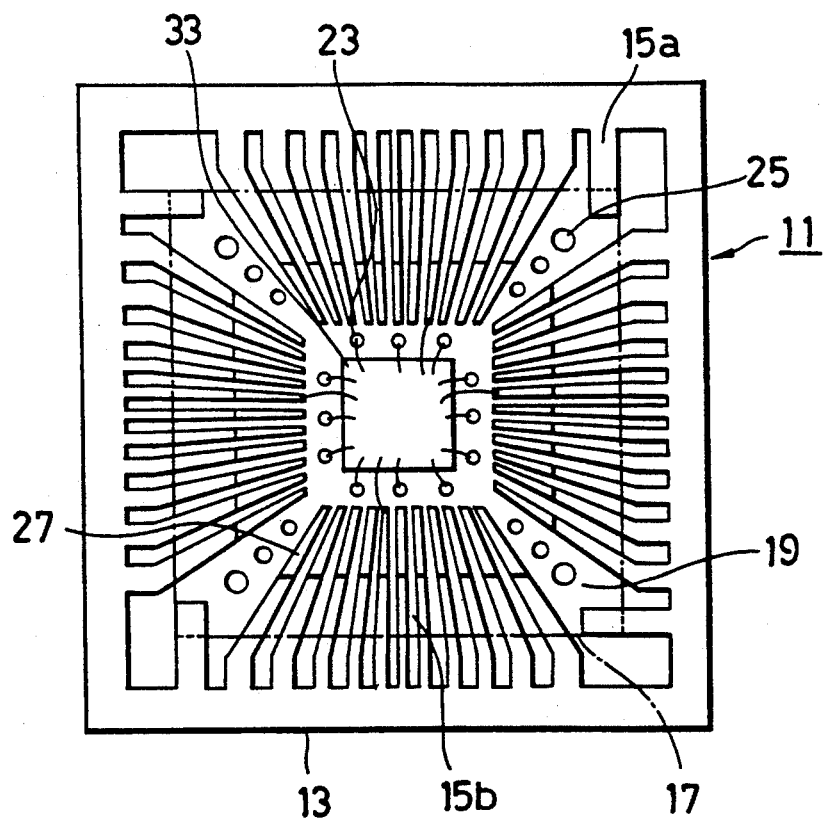
FIG. 3 is a plan view of other embodiment of the high pin count and multi-layer wiring lead frame according to the first aspect of the present invention.
Figure 4:
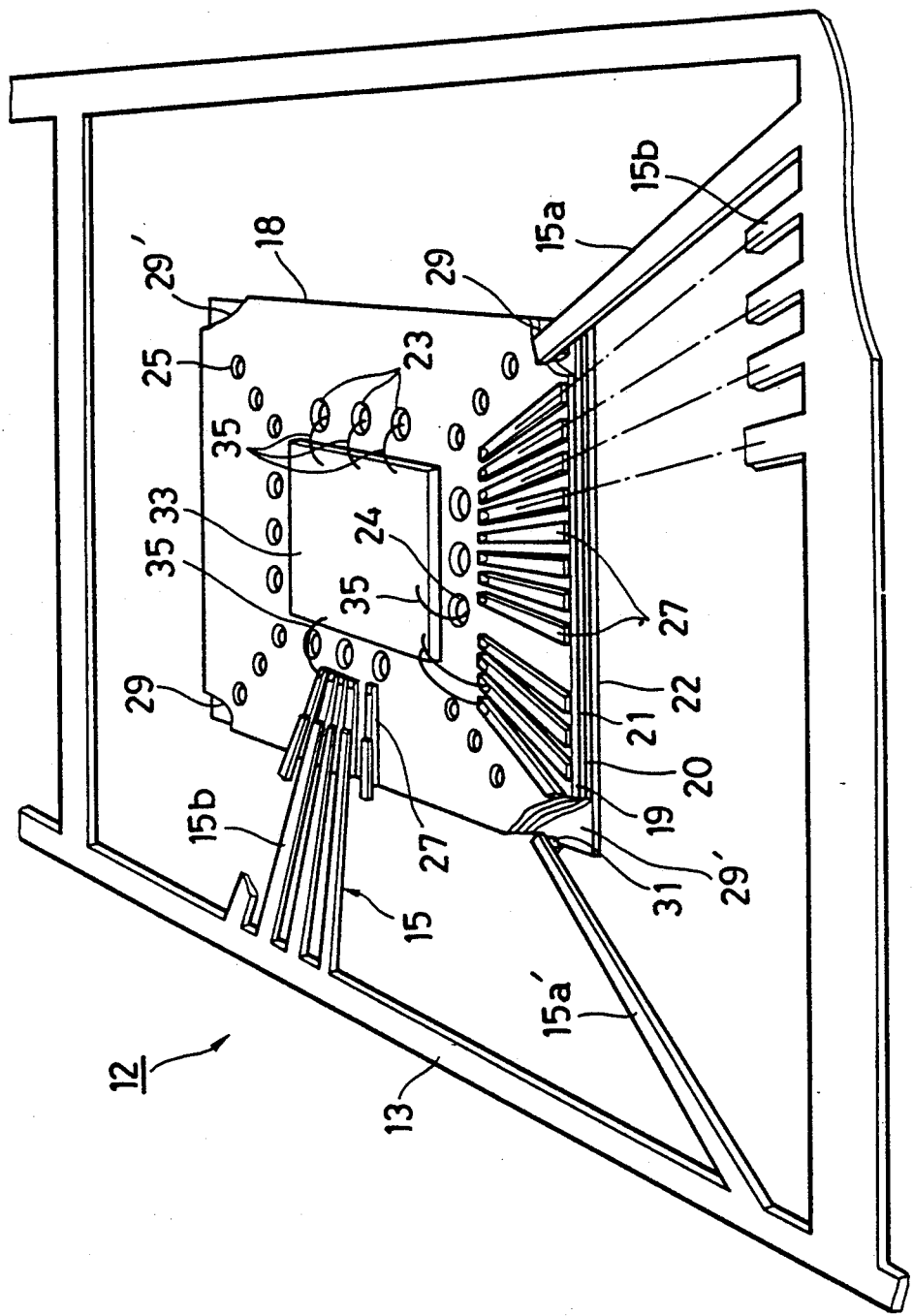
FIG. 4 is a partially cutway perspective view of an embodiment of the high pin count and multi-layer wiring lead frame according to the second aspect of the present invention.
Figure 5A:
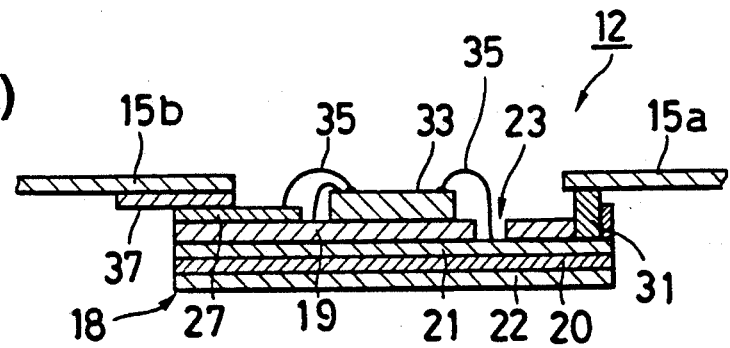
FIG. 5 (a) and FIG. 5 (b) are sectional views of other embodiment of the high pin count and multi-layer wiring lead frame according to the second aspect of the present invention.
Figure 5B:
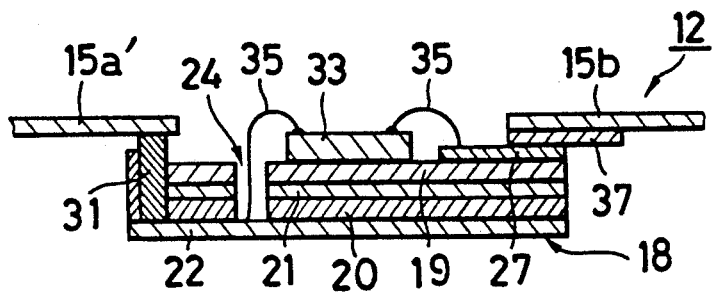
Figure 6:
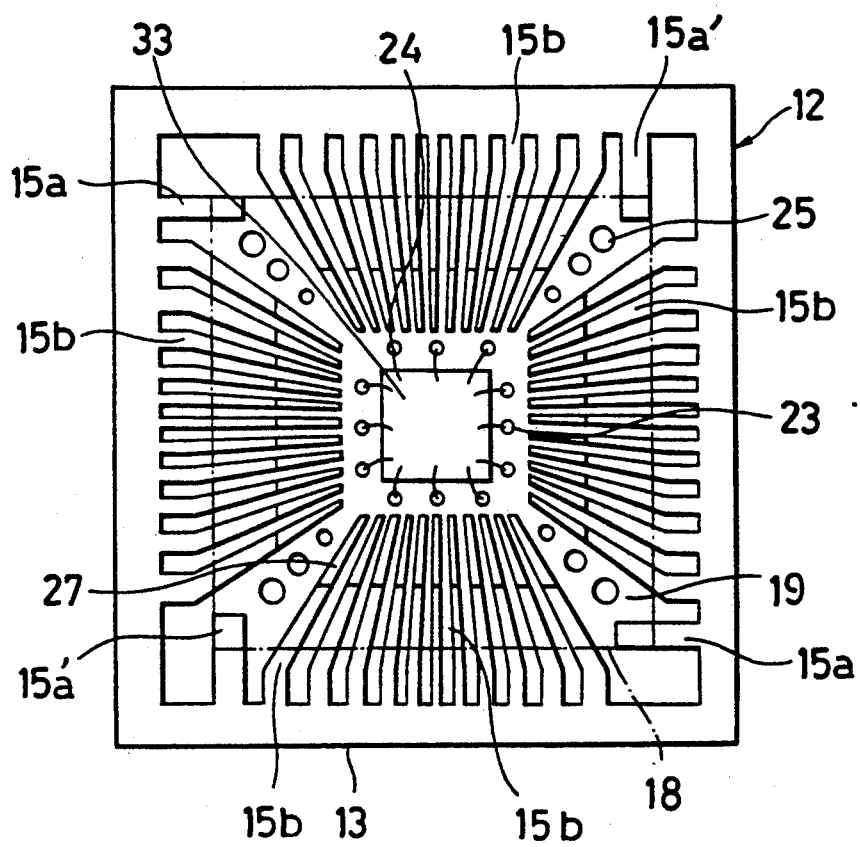
FIG. 6 is a plan view of other embodiment of the high pin count and multi-layer wiring lead frame according to the second aspect of the present invention.

A lead frame 12 according to the second aspect as shown in FIGS. 4 to 6 has a three-layer wiring structure and is completely the same as the lead frame 11 according to the first aspect as shown in FIGS. 1 to 3 except for the insulating film layer 20, the conductive layer 22, the wire bonding holes 24, the cut-out portions 30 and these connections. The same components have the same reference numerals and will not be described in detail.

As shown in FIG. 4, the lead frame 12 is a composite assembly comprising a metal frame consisting of an outer frame 13 and outer leads 15 (15a, 15a' and 15b), and a multi-layer wiring board 18 having a three-layer wiring structure.

The metal frame used in the present invention is identical to the metal frame as shown in FIG. 1, but part of the outer leads 15a extending from the vicinity of the four corners are used as leads for grounding, while the rest used as leads for power supply. The outer leads 15a will be described as leads for grounding and the outer leads 15b as leads for power supply, but the classification of these leads is not limited to this (refer to FIG. 6).

The multi-layer wiring board 18 includes five layers: a signal layer on which a large number of inner leads 27 are formed in a short pitch, high density pattern, an insulating film layer 19, a conductive layer 21 (the same as those of the multi-layer wiring board 17 shown in FIG. 1), an insulating film layer 20 and a conductive layer 22 provided on the rear of the conductive layer 21 via the insulating film layer 20 (refer to FIGS. 5(a) and (b)), and has a three-layer wiring structure which includes the signal layer, the conductive layers 21 and 22. A protective layer made of polyimide film described previously may be provided on the rear of the conductive layer 22, thus bringing the total number of layers to seven including the outer leads 15.

The new insulating film layer 20 and conductive layer 22 are almost the same as the insulating film layer 19 and the conductive layer 21, respectively, in material, shape and size.

In the description below, the conductive layer 21 is used as a conductive layer for grounding, while the conductive layer 22 as a conductive layer for power supply. These conductive layers may be used reversely.

Wire bonding holes 23 and 24, lock holes 25 and cut-out portions 29 and 29' are provided on the multi-layer wiring board 18. The wire bonding holes 23 functions as holes for grounding which go through the insulating film layer 19 in the vicinity of a portion where a semiconductor element is mounted and the inner leads 27 are not formed, and which exposes the conductive layer 21 for grounding. Meanwhile, the wire bonding holes 24 functions as holes for power supply which go through the insulating film layer 19, the conductive layer 21 and the insulating film layer 20 in the vicinity of a portion where the semiconductor element 33 is mounted and the inner leads 27 are not formed, and which exposes the conductive layer for power supply. The cut-out portions 29 function as cut-outs for grounding which are formed by cutting out the insulating film layer 19 to expose the conductive layer 21 for grounding. The cut-out portions 29' function as cut-outs for power supply which are formed by cutting out the insulating film layer 19, the conductive layer 22 for grounding and the insulating film layer 20 to expose the conductive layer 22 for power supply (refer to FIGS. 5(a) and (b)).

The conductive layer 21 exposed from the wire bonding holes 23 and the conductive layer 22 exposed from the wire bonding holes 24 are coated with Sn—Ni base plating and gold plating formed on the base as described in the foregoing to secure firm connection with bonding wires. The bumps 31 may be formed on the cut-out portions 29 and 29' in advance by solder plating or the like to connect the outer leads 15a and 15a' to the exposed conductive layers 21 and 22, as described in the foregoing. The bumps 31 may be formed on the outer leads 15a and 15a' in advance.

As described in the foregoing, connection between the multi-layer wiring board 18 and the outer leads 15 (15a, 15a' and 15b) is performed by the following procedure: (1) aligning properly the inner leads 27 with the outer leads 15b for signals and overlapping them via the solder plated layer 37, (2) aligning properly the outer leads 15a for grounding with the conductive layer 21 for grounding exposed from the cut-out portions 29 for grounding and overlapping them via the bumps 31, and (3) aligning properly the outer leads 15a' for power supply with the conductive layer 22 for power supply exposed from the cut-out portions 29' for power supply and overlapping them via the bumps 31, and (4) thermally joining them together.

A semiconductor element 33 is mounted on the high pin count and multi-layer wiring lead frame 12 thus obtained. The signal terminals of the semiconductor element 33 and the plated terminals at the tip of the inner leads 27 are connected by bonding wires 35. At the same time, the grounding terminals and power supply terminals of the semiconductor element 33 are joined to the conductive layer 21 exposed from the holes 23 for grounding and the conductive layer 22 exposed from the holes 24 for power supply by the bonding wires 35, respectively. Finally, the composite assembly thus obtained is resin sealed to produce a semiconductor device as described previously.

The production method for the multi-layer wiring board 18 of the lead frame 12 according to the second aspect is not limited. As far as the inner leads 27, the holes 23, 24 and 25, and cut-out portions 29 and 29' are properly formed, the orders of forming these parts and connecting them to each layer are not limited.

The lead frame 12 shown in the figure has a three-layer wiring structure, but the high pin count and multi-layer wiring lead frame according to the second aspect is not limited to this. Another conductive layer may be formed on the lowest conductive layer of the multi-layer wiring board via the insulating film layer to achieve a four or more layer wiring structure.

As being understood from the above detailed explanation, in the high pin count and multi-layer wiring lead frame according to the present invention, the inner leads are separated from the outer leads made of metal frame, thus making it possible to form the inner leads in a short pitch, high density pattern and significantly shorten the lead pitch. Particularly, when a flexible printed circuit board made of double-layer CCL having a copper foil signal layer and a polyimide resin layer is used to form inner leads, a high density wiring structure is possible. Furthermore, the lead frame according to the present invention is free from the deformation of the inner leads. In addition, the lead frame according to the present invention has high reliability of surface mounting due to a rigid mounter lead frame made of metal frame.

The lead frame according to the present invention comprises a conductive layer for grounding, a conductive layer for power supply and a conductive layer for both grounding and power supply, or at least a pair of separate conductive layers for grounding and a pair of separate conductive layers for power supply, to separate a plane for signal wires from a plane for at least either one of grounding wires and power supply wires, thus making it possible to remove the induction current of the leads for signals and to reduce inductance. As a result, this secures lowered noises and fast response, and enhances transmission characteristics.

In the lead frame of the present invention, a hole from which a metal plate, for instance, is exposed is disposed at a proper position, whereby the length of bond wires can be reduced. Furthermore, in the lead frame according to the present invention, portions to be wire bonded are plated with gold or silver to reduce floating capacitance. Due to a reduction in inter-lead capacitance, wire length and floating capacitance, the lead frame according to the present invention has an effect of shortening delay time and thus enhancing transmission characteristics.

Moreover, in the lead frame according to the present invention, each lead is short-circuited uniformly to at least one of a conductive layer for grounding, a conductive layer for power supply and a conductive layer for both grounding and power supply. Therefore, even if a current is concentrated on a specific location of an IC chip when power is supplied after a semiconductor is mounted, the current is not concentrated on a specific lead. In the lead frame according to the present invention, a reduction in wire length leads to a decline in self-inductance with the result of minimized potential variations caused by switching. These effectively reduce noises at the time of power supply and improve transmission characteristics.

The lead frame according to the present invention has the effect of facilitating production due to its assembly structure.

EXAMPLES

The present invention will be described in detail referring to the examples.

EXAMPLE 1

First, 0.15 mm thick 42 % Fe—Ni alloy was used to fabricate the outer frame of a metal frame 13 having a capacity of 304 pins and outer leads 15 (15a and 15b) as shown in FIGS. 2 and 3. The pitch at the tip of the outer leads 15b is 0.37 mm.

Next, holes 23 for both grounding and power supply and lock holes 25 were formed on a 0.07 mm thick polyimide film layer 19 having a 0.02 mm thick copper foil on one side thereof. After a 0.005 to 0.01 mm thick copper foil was adhered to the rear of this polyimide insulating film layer 19, the 0.02 mm thick copper foil on the top of the layer was etched to form inner leads 27 at a pitch of 0.12 mm. The inner tips of the inner leads 27 were plated with Au/Ni to fabricate a multi-layer wiring board 17 having a double-layer wiring structure.

The outer ends of the inner leads 27 of the multi-layer wiring board 17 thus obtained were partly overlapped with the leads 15b for signals of the solder plated outer leads 15. The inner leads and the outer leads were joined together using the infrared beam heating method. Reference numeral 37 is a solder joined layer. The bumps 31 were formed by soldering or with an anisotropic conductive film on the metal sheet conductive layer 21 exposed from the insulating film 19 of the multi-layer wiring board 17. The leads 15a for both grounding and power supply were thermally connected to the bumps 31 to fabricate the high pin count and multi-layer wiring lead frame 11 having a capacity of 304 pins of the first aspect.

A semiconductor element 33 for DIPs having 304 pins disposed on each side 13.5 mm long was mounted on the lead frame 11 thus obtained using an adhesive or the like. The signal terminals of this semiconductor element 33 were bonded to the plated ends of the inner leads 27 by 25 μm-diameter gold bond wires 35. The power supply and grounding terminals of the semiconductor element 33 were similarly bonded to holes 23 for both grounding and power supply of the multi-layer wiring board 17. The composite assembly thus obtained was resin sealed to produce a semiconductor device having 304 pins.

The lead frame of the prior art consisting of a single layer was used to fabricate a semiconductor device for comparison. The electric characteristics of leads for both grounding and power supply and signal leads of these semiconductor devices were measured. 10 leads for both grounding and power supply, and signals for each of 10 lead frames were measured for each measurement item. That is, 100 leads obtained by multiplying 10 frames by 10 leads were measured to achieve minimum, maximum and average measurement values. The results of the measurements are shown in Table 1.

TABLE 1

| Electric characteristics | Examples of present invention | | Examples of prior art | |
|---|---|---|---|---|
| Leads for both power supply and grounding | | | | |
| resistance (mΩ) | min 6.0<br>max 7.5 | $\bar{x} = 6.9$ | min 13.0<br>max 21.0 | $\bar{x} = 17.5$ |
| capacitance (PF) | min 230<br>max 245 | $\bar{x} = 239$ | min 0.56<br>max 0.85 | $\bar{x} = 0.79$ |
| inductance (nH) | min 5.3<br>max 7.7 | $\bar{x} = 6.3$ | min 7.9<br>max 9.9 | $\bar{x} = 8.7$ |
| Leads for signals | | | | |
| capacitance (PF) | min 0.23<br>max 0.27 | $\bar{x} = 0.25$ | min 0.57<br>max 0.75 | $\bar{x} = 0.67$ |
| impedance (Ω) | min 203<br>max 297 | $\bar{x} = 253$ | min 305<br>max 430 | $\bar{x} = 393$ |

As understood from this table, the capacitance and impedance between leads for signals of the semiconductor device which uses the multi-layer lead frame of the present invention are much lower than those of leads for signals of the semiconductor device which uses the single-layer lead frame of the prior art. Furthermore, the resistance and impedance of leads for both grounding and power supply in the example of the present invention are smaller than those of the prior art, but the capacitance is much higher. As a result, voltage variations at the time of power supply are minimized, thus lowering noises.

EXAMPLE 2

First, 0.15 mm thick 42% Fe—Ni alloy was used to fabricate an outer frame 13 and outer leads 15a, 15a' and 15b as shown in FIGS. 5(a), 5(b) and 6. The pitch at the tip of the outer leads 15b is 0.37 mm.

Next, holes 23 for grounding, holes 24 for power supply and cut-out portions 29 and 29' were formed on a 0.07 mm thick polyimide insulating film layer 19 having a 0.02 mm thick copper foil on one side thereof. Then, a 0.005 to 0.01 mm thick copper foil (conductive layer 21) was adhered on the other side of the polyimide insulating film 19 to fabricate a multi-layer wiring board 18 having a double-layer wiring structure. A metal sheet 22 (conductive layer) for power supply, which was the third layer, was joined to the polyimide insulating film layer 20 using an adhesive to fabricate a multi-layer wiring board 18 having a three-layer wiring structure. At this time, openings equivalent to the holes 24 for power supply were also formed on the insulating film layer 20 to expose the metal sheet 22 for power supply from the holes 24 for power supply.

The 0.02 mm thick copper foil of this multi-layer wiring board 18 was etched to form inner leads at a pitch of 0.12 mm. The inner ends of the inner leads 27 were plated with Au/Ni, and the outer ends of the inner leads 27 were partly overlapped with leads 15b for signals of the solder plated outer leads 15. Then, the inner leads 27 were joined with the outer leads 15 using the infrared beam heating method. Reference numeral 37 is a solder joined layer.

Meanwhile, the bumps 31 was formed by soldering or with an anisotropic conductive film on a cut-out portion 29 for grounding and a cut-out portion 29' for power supply which expose the metal sheet (conductive layer) 21 and the metal sheet (conductive layer) 22, respectively, from the insulating film layer 19 of the multi-layer wiring board 18. The leads 15a and 15a' for grounding and power supply were thermally connected to the bumps 31 to produce a high pin count and multi-layer wiring lead frame 12 of the second aspect. At this time, the bumps 31 may be formed on the tip of the outer leads 15a and 15a' as shown in FIG. 4.

A semiconductor element 33 for DIPs having 304 pins on each side 13.5 mm long was mounted on the multi-layer wiring lead frame 12 thus obtained with an adhesive or the like. The signal terminals of the semiconductor element 33 were bonded to the plated ends of the inner leads 27 by 25 μm-diameter gold bond wires 35. The grounding and power supply terminals of the semiconductor element 33 were similarly bonded to the conductive layers 21 and 22 through the holes 23 and 24 for grounding and power supply of the multi-layer wiring board 18, respectively. The composite assembly thus obtained was resin sealed to fabricate a semiconductor device having 304 pins.

A semiconductor device was fabricated using a single-layer lead frame of the prior art for comparison.

The electric characteristics of the leads for power supply, grounding and signals of these semiconductors were measured. 10 leads for grounding, power supply and signals were measured for each of 10 frames. As a result, a total of 100 leads obtained by multiplying 10 frames by 10 leads were measured to achieve the minimum, average and maximum measurement values. The results of the measurements are shown in Table 2.

TABLE 2

| Electric characteristics | Examples of present invention | | Examples of prior art | |
|---|---|---|---|---|
| Leads for power grounding | | | | |
| resistance (mΩ) | min 6.0<br>max 7.5 | $\bar{x} = 6.9$ | min 13.0<br>max 21.0 | $\bar{x} = 17.5$ |
| capacitance (PF) | min 230<br>max 245 | $\bar{x} = 239$ | min 0.56<br>max 0.85 | $\bar{x} = 0.79$ |
| inductance (nH) | min 5.3<br>max 7.7 | $\bar{x} = 6.3$ | min 7.9<br>max 9.9 | $\bar{x} = 8.7$ |
| Leads for power supply | | | | |
| resistance (mΩ) | min 6.3<br>max 7.8 | $\bar{x} = 7.0$ | min 13.0<br>max 21.0 | $\bar{x} = 17.5$ |
| capacitance (PF) | min 240<br>max 257 | $\bar{x} = 249$ | min 0.56<br>max 0.85 | $\bar{x} = 0.79$ |
| inductance (nH) | min 5.0<br>max 7.0 | $\bar{x} = 6.3$ | min 7.9<br>max 9.9 | $\bar{x} = 8.7$ |
| Leads for signals | | | | |
| capacitance (PF) | min 0.23 | $\bar{x} = 0.25$ | min 7.9 | $\bar{x} = 8.7$ |

TABLE 2-continued

| Electric characteristics | Examples of present invention | | Examples of prior art | |
|---|---|---|---|---|
| impedance (Ω) | max 0.27<br>min 203<br>max 297 | x̄ = 253 | max 9.9<br>min 305<br>max 430 | x̄ = 393 |

As understood from the table above, the capacitance and impedance between leads for signals of the semiconductor device which uses the multi-layer wiring lead frame of the present invention are much lower than those of leads for signals of the semiconductor device which uses the single-layer lead frame of the prior art. In addition, the resistance and inductance of leads for grounding and power supply in the example of the present invention are lower and the capacitance higher than those of the prior art. These minimizes voltage variations at the time of power supply, thus lowering noises.

What is claimed is:

1. A high pin count and multi-layer wiring lead frame comprising:
   an inner multi-layer portion, including:
      a conductive layer for providing one of a ground and power from a power supply;
      an insulating layer formed on said conductive layer; and
      a plurality of inner leads formed on said insulating layer in a high density pattern by one of an etching process and a vapor deposition process;
   a metal frame portion surrounding at least a portion of said inner multi-layer portion, said metal frame portion having a plurality of outer leads for providing at least one of a signal transmission therethrough, a connection to said ground, and a connection to said power supply;
   said inner leads formed on said insulating layer of said inner multi-layer portion being electrically connected to said outer leads of said metal frame portion, said outer leads, when providing said at least one of said ground and said connection to said power supply, being connected to said conductive layer; and
   a plurality of apertures formed in said insulating layer for exposing portions of said conductive layer for thereby enabling a wire bonding of a plurality of electrodes of a semi-conductor element to said exposed portions of said conductive layer.

2. A high pin count and multi-layer wiring lead frame according to claim 1, wherein a plurality of tip end portions of said plurality of inner leads and said exposed portions of said conductive layer are plated with one of gold and silver.

3. A high pin count and multi-layer wiring leads frame according to claim 1, wherein said plurality of inner leads are formed on said insulating layer by etching a copper foil layer on a polyamide film having a copper foil on a side thereof.

4. A high pin count and multi-layer wiring lead frame according to claim 1, wherein said plurality of inner leads are formed on said insulating layer and are aligned and connected to said plurality of outer leads of said metal frame portion for simultaneously providing said signal transmission therethrough, said connection to ground and said connection to said power supply.

5. A high pin count and multi-layer wiring lead frame according to claim 1, wherein said insulating layer includes a plurality of cut-out portions for exposing said conductive layer therethrough.

6. A high pin count and multi-layer wiring lead frame according to claim 5, wherein a portion of said conductive layer, exposed through said cut-out portions, is provided with a plurality of bumps for connecting said conductive layer to said plurality of outer leads provided on said metal frame portion.

7. A high pin count and multi-layer wiring lead frame according to claim 1, wherein said inner multi-layer portion comprises a flexible multi-layer wiring board.

8. A high pin count and multi-layer wiring lead frame comprising:
   an inner multi-layer portion, including:
      at least a first and a second laminable conductive layer for respectively providing a ground connection and power from a power supply;
      a first insulating layer formed on said first conductive layer;
      a second insulating layer formed on said second conductive layer; and
      a plurality of inner leads formed on that one of said first and second insulating layers which is provided on an uppermost one of said first and second conductive layers when said conductive layers are viewed in a cross-sectional direction, said plurality of inner leads being formed in a high density pattern by one of an etching process and a vapor deposition process;
   a metal frame portion surrounding at least a portion of said inner multi-layer portion, said metal frame portion having a plurality of outer leads;
   said plurality of outer leads of said metal frame portion being connected to provide a transmission of signals therethrough, and a connection to a ground and a connection to a power supply;
   said plurality of inner leads, formed on said insulating layer provided on said uppermost conductive layer, being electrically connected to said plurality of outer leads formed on said metal frame portion, for providing said signal transmission therethrough, said connection to said ground and said connection to said power supply;
   said outer leads when providing said connection to said ground and said connection to said power supply, being respectively connected to said first and second conductive layers for respectively providing said ground and power from said power supply to said inner multi-layer portion; and
   a plurality of apertures formed in said first and second insulating layers for exposing portions of said first and second conductive layers for thereby enabling a wire bonding of a plurality of electrodes of a semi-conductor element to exposed portions of each of said first and second conductive layers.

9. A high pin count and multi-layer wiring lead frame according to claim 8, wherein:
   a plurality of tip end portions of said inner leads and exposed portions of said conductive layers are plated with one of gold and silver.

10. A high pin count and multi-layer wiring lead frame according to claim 9, wherein said lead frame includes in the order named:
   a layer for providing said inner leads;
   said first insulating layer;
   said first conductive layer for providing said ground;
   said second insulating layer; and said second conductive layer for connection to said power supply.

11. A high pin count and multi-layer wiring lead frame according to claim 8, wherein said plurality of apertures comprise cut-out portions for exposing each of said conductive layers provided in a plurality of corner portions of said inner multi-layer portion, said inner multi-layer portion including said inner leads, a plurality of insulating layers and a plurality of conductive layers.

12. A high pin count and multi-layer wiring lead frame according to claim 11, wherein a plurality of bumps are provided in said plurality of corner portions for connecting said first and second conductive layers to selected ones of said plurality of outer leads.

13. A high pin count and multi-layer wiring lead frame according to claim 11, wherein said inner multi-layer portion comprises a flexible multi-layer wiring board.

* * * * *